(12) United States Patent
Kikuchi et al.

(10) Patent No.: US 10,950,442 B2
(45) Date of Patent: Mar. 16, 2021

(54) METHODS TO RESHAPE SPACERS FOR MULTI-PATTERNING PROCESSES USING THERMAL DECOMPOSITION MATERIALS

(71) Applicant: Tokyo Electron Limited, Tokyo (JP)

(72) Inventors: Yuki Kikuchi, Albany, NY (US); Toshiharu Wada, Albany, NY (US); Kaoru Maekawa, Albany, NY (US); Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/460,575

(22) Filed: Jul. 2, 2019

(65) Prior Publication Data
US 2020/0013619 A1 Jan. 9, 2020

Related U.S. Application Data

(60) Provisional application No. 62/694,639, filed on Jul. 6, 2018, provisional application No. 62/732,241, filed on Sep. 17, 2018.

(51) Int. Cl.
*H01L 21/311* (2006.01)
*H01L 21/033* (2006.01)
*H01L 21/02* (2006.01)

(52) U.S. Cl.
CPC ...... *H01L 21/0337* (2013.01); *H01L 21/0206* (2013.01); *H01L 21/31116* (2013.01); *H01L 21/31144* (2013.01)

(58) Field of Classification Search
CPC ............ H01L 21/0206; H01L 21/0228; H01L 21/0337; H01L 21/31055; H01L 21/31116; H01L 21/31111; H01L 21/31144
USPC ........................................................ 438/703
See application file for complete search history.

(56) References Cited

U.S. PATENT DOCUMENTS

| | | | | |
|---|---|---|---|---|
| 6,165,890 A | * | 12/2000 | Kohl | H01L 21/7682 257/E21.581 |
| 2010/0112496 A1 | * | 5/2010 | Nakajima | H01L 21/02274 430/325 |
| 2015/0243519 A1 | * | 8/2015 | deVilliers | H01L 21/0228 438/692 |
| 2017/0069495 A1 | * | 3/2017 | Mohanty | H01L 21/0337 |
| 2017/0301552 A1 | * | 10/2017 | deVilliers | H01L 21/0337 |

* cited by examiner

*Primary Examiner* — Brook Kebede
(74) *Attorney, Agent, or Firm* — Rothwell, Figg, Ernst & Manbeck, P.C.

(57) ABSTRACT

Embodiments are disclosed that improve etch uniformity during multi-patterning processes for the manufacture of microelectronic workpieces by reshaping spacers using thermal decomposition materials as a protective layer. Because the thermal decomposition material can be removed through thermal treatment processes without requiring etch processes, spacers can be reshaped with no spacer profile change or damage while suppressing undesired gouging differences in underlying layers and related degradation in etch uniformity.

17 Claims, 6 Drawing Sheets

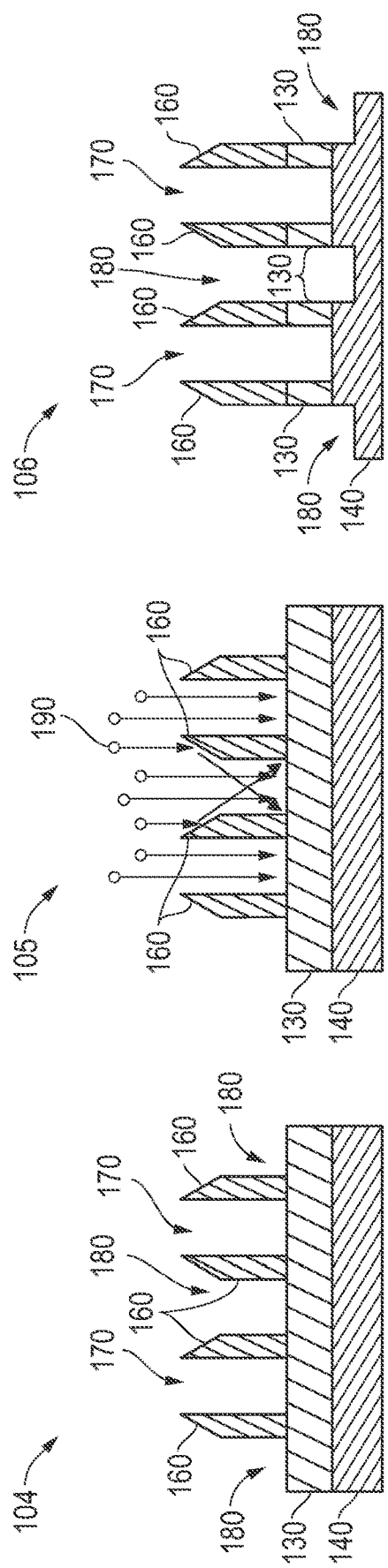

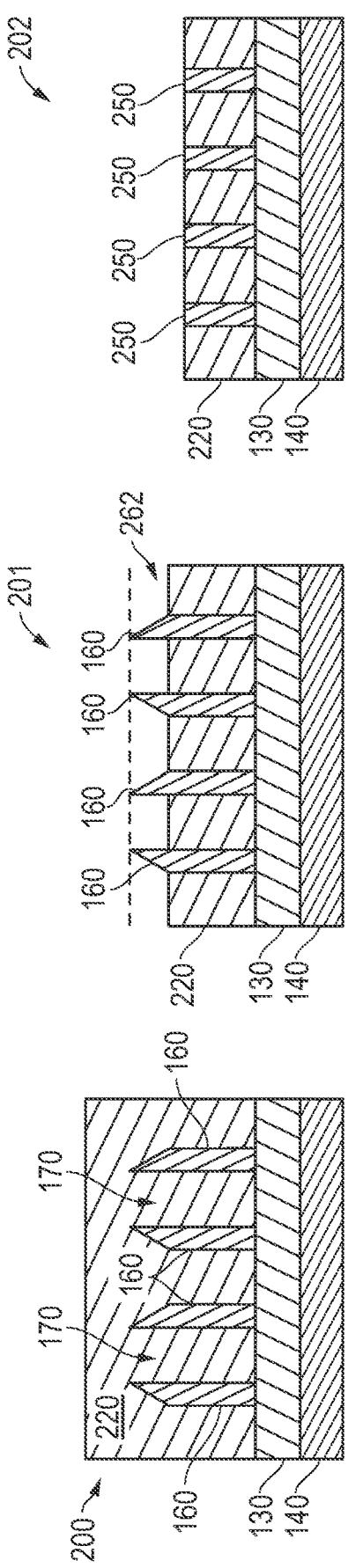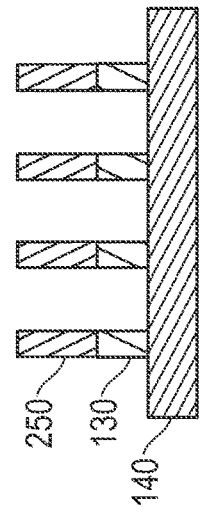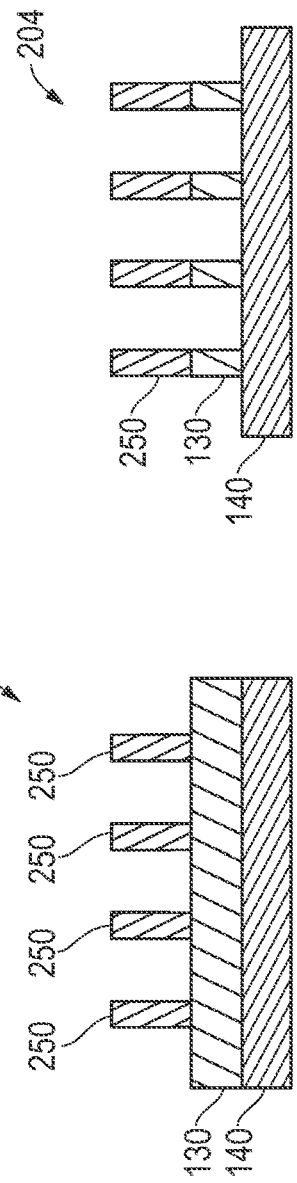

METHODS TO RESHAPE SPACERS FOR MULTI-PATTERNING PROCESSES USING THERMAL DECOMPOSITION MATERIALS

RELATED APPLICATIONS

This application claims priority to the following provisional applications: U.S. Provisional Patent Application Ser. No. 62/694,639, filed Jul. 6, 2018, entitled "METHODS TO RESHAPE SPACERS FOR MULTI-PATTERNING PROCESSES USING THERMAL DECOMPOSITION MATERIALS" and U.S. Provisional Patent Application Ser. No. 62/732,241, filed Sep. 17, 2018, entitled "METHODS TO RESHAPE SPACERS FOR MULTI-PATTERNING PROCESSES USING THERMAL DECOMPOSITION MATERIALS" which are hereby incorporated by reference in their entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Self-aligned multiple patterning (SAMP) processes, such as self-aligned double patterning (SADP) processes and self-aligned quadruple patterning (SAQP), have been developed to reduce feature sizes beyond what is directly achievable by lithography processes. For some SAMP processes and particularly for SADP processes, spacers are typically formed as side wall structures adjacent cores on a substrate being processed, and the core material is later removed. This core removal process is typically called a mandrel pull and is often performed by a plasma etch process such as a reactive ion etch (RIE) process.

For prior SAMP processes, the height of the spacers after the mandrel pull process are typically different with respect to the portions of the spacers adjacent to the cores and the portions of the spacers adjacent the gaps between the cores. This asymmetric shape of the spacers degrades etch uniformity and introduces gouging differences during later etch processes. For example, these asymmetric shapes often cause gouging differences to form between portions of an underlying material layer below the removed cores and portions of the underlying material layer below the gaps between the cores. This degradation occurs, for example, when the patterned formed by the spacers is transferred through an etch process to an underlying layer, such as a hard mask layer.

FIGS. 1A-G (Prior Art) provide cross-section views of an example for prior solutions where degradation of etch uniformity is caused in subsequent pattern transfer due to the asymmetric shape of the top portions of spacers that remain after the mandrel pull within a SAMP process. The asymmetric shape of the spacers and resulting degradation in etch uniformity can introduce deterioration of line edge roughness (LER) and line width roughness (LWR) parameters. The asymmetric spacer shape also tends to cause pitch walking due to the deterioration of gouging depth within the underlying layers.

FIG. 1A (Prior Art) provides cross-section views for an example embodiment 100 where stacked layers have been formed on a material layer 140. The stacked layers include an anti-reflective layer 110, a core material layer 120, and a hard mask layer 130. In addition, a photoresist layer 145 has been deposited and patterned, for example, using lithography and etch processes. It is noted that the hard mask layer 130 can be a nitride (SiN) layer or some other hard mask material layer. The additional material layer 140 that lies under the stacked layers can be a substrate, such as a silicon substrate, or can be an additional material layer formed on a substrate. The core material layer 120 can be an OPL (organic planarization layer) layer, an amorphous silicon layer, and/or another material layer. Other variations and material layers and/or structures could also be implemented.

FIG. 1B (Prior Art) provides a cross-section view of an example embodiment 101 after the photoresist (PR) pattern is transferred to underlying layers above the hard mask layer 130. For example, one or more etch processes can be used to transfer the pattern formed in the PR layer 145 to underlying layers 110/120 and to form cores 150.

FIG. 1C (Prior Art) provides a cross-section view of an example embodiment 102 after a spacer material layer 155 has been deposited. As shown, the spacer material layer 155, such as an oxide layer, is deposited over the cores 150. The cores 150 still include the anti-reflective layer 110 and the core material layer 120.

FIG. 1D (Prior Art) provides a cross-section view of an example embodiment 103 after an etch back process has been performed. For example, an etch back process is performed to etch back the spacer layer 155 and form spacers 160 along the side walls of the cores 150. This etch back process can also remove the anti-reflective layer 110 shown in FIG. 1C thereby leaving only the core material layer 120 for the cores 150.

FIG. 1E (Prior Art) provides a cross-section view of an example embodiment 104 after a mandrel pull process has been performed. As shown, the mandrel pull process, such as an ash process, is used to remove the cores 150 shown in FIG. 1D. After this mandrel pull process, however, asymmetric spacers 160 are left. In particular, the edges of the spacers 160 on the sides adjacent core regions where cores were pulled are higher than the edges of the spacers 160 on the sides adjacent gap regions where there were gaps between the cores. The core regions are indicated by arrows 170, and the gap regions are indicated by arrows 180.

FIG. 1F (Prior Art) provides a cross-section view of an example embodiment 105 for a subsequent etch process where the asymmetric shapes of the spacers 160 cause a degradation in etch uniformity. For example, during a subsequent etch of the hard mask layer 130, this lack of uniformity in shape for the spacers 160 causes degradation in etch uniformity and uneven gouging in the underlying material layer 140. In particular, more components 190 of the etch chemistry are able to reach or impact the hard mask layer 130 within the gap regions 180 as compared to the core regions 170. This causes increased gouging to occur within the underlying layer 140 within the gap regions 180.

FIG. 1G (Prior Art) provides a cross-section view of an example embodiment 106 for the results of the etch process of FIG. 1F (Prior Art). As shown, differences in etch uniformity and gouging leaves portions of the underlying material layer 140 in the gap regions 180 between the removed cores having different levels of gouging as compared with portions of the underlying layer 140 in core regions 170 under the removed cores. Thus, etch uniformity is degraded giving rise to various potential problems as described above.

SUMMARY

Embodiments are described herein to reshape spacers using thermal decomposition materials to improve etch uniformity and reduce gouging during pattern transfer associated with self-aligned multiple-patterning (SAMP) processes. These improvements are achieved by forming a thermal decomposition layer over spacers formed during SAMP processes, exposing asymmetric top portions of the spacers, and removing or flattening these asymmetric top portions of the spacers. This reshaping of the spacers is performed after mandrel pull processes have removed cores and prior to pattern transfer to underlying layers. This flattening or removal of asymmetric portions of the spacers increases etch uniformity with respect to portions of the underlying material layer below the cores and the portions of the underlying material layer below the gaps between the cores. Further, the use of the thermal decomposition material achieves spacer reshaping without damage to the spacer profiles or the spacers themselves. Different or additional features, variations, and embodiments can also be implemented, and related systems and methods can be utilized as well.

For one embodiment, a method to improve etch uniformity of an underlying layer for processing of microelectronic workpieces is disclosed including providing a substrate with a material layer, performing a self-aligned multi-patterning (SAMP) process to form spacers on the material layer, forming protective plugs between the spacers using a thermal decomposition material, reshaping the spacers, and removing the thermal decomposition material using a thermal treatment.

In additional embodiments, the forming includes forming a layer of thermal decomposition material over the spacers, and performing an etch back of the layer of thermal decomposition material using a thermal treatment to form the protective plugs between the spacers. In further embodiments, asymmetric portions of the spacers remain exposed after the performing of the etch back of the layer of thermal decomposition material. In still further embodiments, the reshaping includes removing the asymmetric portions of the spacers. In still further embodiments, the reshaping leaves planar top surfaces for the spacers.

In additional embodiments, the method also includes transferring a pattern for the spacers to the material layer after the removing of the thermal decomposition material. In further embodiments, a target level of etch uniformity is achieved in the transferring of the pattern. In still further embodiments, a plasma etch process is used to transfer the pattern for the spacers to the material layer. In further embodiments, the material layer is a hard mask layer formed on an additional material layer. Still further, a target level of gouging for the additional material layer can be achieved in the transferring of the pattern.

In additional embodiments, the SAMP process includes forming cores over the material layer, depositing a spacer layer over the cores, performing an etch back of the spacer layer to leave spacers as side wall structures adjacent the cores, and performing a mandrel pull process to remove the cores and leave the spacers.

In additional embodiments, the thermal treatment has a temperature range from 100 to 450 degrees Celsius (° C.). In further embodiments, the thermal treatment includes an anneal process.

In additional embodiments, the thermal decomposition material has a depolymerizability characteristic such that it can be removed by thermal treatment of 100 to 450 degrees Celsius. In further additional embodiments, the thermal decomposition material has a depolymerizability characteristic such that it can be removed by thermal treatment of 250 to 450 degrees Celsius and such that it is stable from 150 to 215 degrees Celsius. In additional embodiments, a rate for the removing is controlled by adjusting at least one of temperature or pressure for the thermal treatment.

In additional embodiments, the thermal decomposition material includes at least one of urethane, polymethyl methacrylate (PMMA), or a monomer. In further embodiments, the thermal decomposition material includes an ashing-less coating (ALC) material.

In additional embodiments, the ALC material includes a urea binding resin. In still further embodiments, the urea binding resin includes polyurea having depolymerizability characteristics such that it can be removed by thermal treatment of less than 450 degrees Celsius.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 1A-1G (Prior Art) provide cross-section views for prior solutions where degradation of etch uniformity is caused in subsequent pattern transfer due to the asymmetric shape of the top portions of spacers that remain after the mandrel pull within a SAMP process.

FIGS. 2A-2E provide cross-section views of an example embodiment where thermal decomposition materials are used as protective plugs between spacers while spacers are reshaped to thereby reduce or eliminate the degradation in etch uniformity experienced in prior solutions.

DETAILED DESCRIPTION

As described herein, etch uniformity is improved during multi-patterning processes for the manufacture of microelectronic workpieces by reshaping spacers using thermal decomposition materials as a protective layer. Because the thermal decomposition material can be removed through thermal treatment processes without requiring etch processes, the spacers can be reshaped with no spacer profile change or damage while suppressing undesired gouging differences in underlying layers and related degradation in etch uniformity. Other advantages and implementations can also be achieved while still taking advantage of the process techniques described herein.

As described herein, thermal decomposition materials are used to reshape spacers formed from multiple patterning processes so that etch uniformity is improved and gouging differences in underlying layers is reduced during the manufacture of microelectronic workpieces. The thermal decomposition materials are preferably materials that can be removed with a thermal treatment having a temperature range from 100 to 450 degrees Celsius (° C.). For one embodiment, an ashing-less coating (ALC) material can be used as the thermal decomposition material, and this ALC material can be removed by thermal treatment using a de-polymerization temperature from 300° C. to 400° C. Other thermal decomposition materials can also be used, such a urea binding resin, that have depolymerizability characteristics such that they can be removed by thermal treatment from 200° C. to 240° C. Other thermal decomposition materials can also be used that can be removed using thermal treatments from 100° C. to 450° C. More generally, thermal decomposition materials having depolymerizability characteristics such that they can be removed by thermal treatment from 100° C. to 450° C. are preferable for the embodiments described herein. These low temperature processes reduce gouging of underlying material layers in SAMP processes such as SADP and SAQP processes.

Figure 1A:
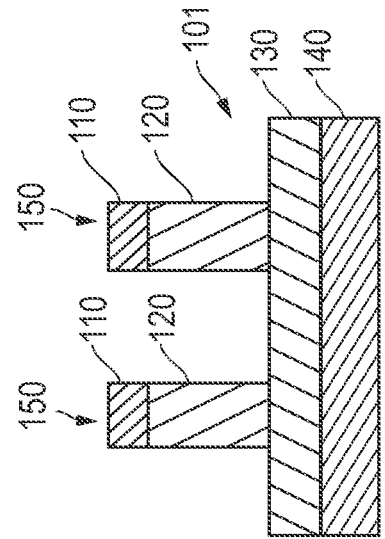
Figure 1B:
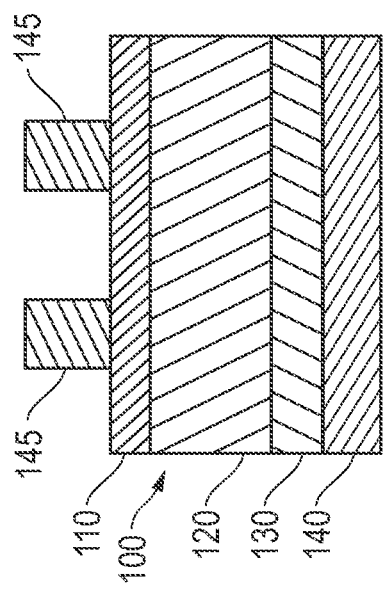
Figure 1C:
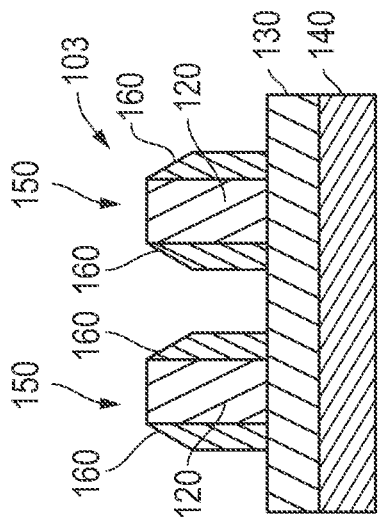
Figure 1D:
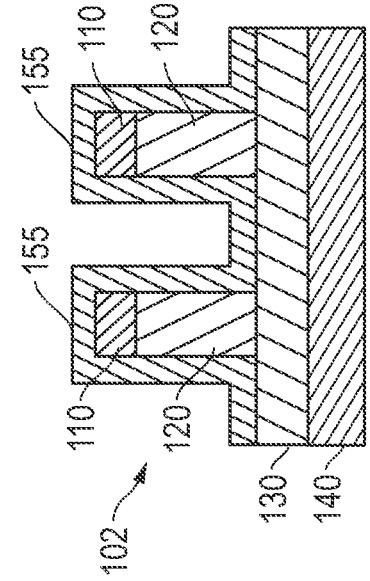

FIGS. 2A-2E provide cross-section views of an example embodiment where thermal decomposition materials are used as protective plugs between spacers while spacers are reshaped to thereby reduce or eliminate the gouging differences and degradation in etch uniformity experienced in prior solutions. Initially, it is further noted that FIGS. 2A-2E follow FIG. 1E (Prior Art) and provide an improvement to prior solutions by using thermal decomposition material as protective plugs between spacers during spacer reshaping thereby reducing or eliminating gouging differences and improving etch uniformity.

FIG. 2A provides cross-section view of an example embodiment 200 where a layer of thermal decomposition material 220 is formed over spacers 160 as well as underlying material layer 130 and additional material layer 140. As indicated above, the underlying material layer 130 can be, for example, a hard mask layer (e,g, SiN) formed on the additional material layer 140. As noted above, the spacers 160 have been left after a mandrel pull that removed cores from core region 170 between the spacers 160. However, as also indicated above, the spacers 160 are left with asymmetric top portions that lead to gouging differences and degradation in etch uniformity. The layer of thermal decomposition material 220 covers the spacers 160.

FIG. 2B provides a cross-section view of an example embodiment 201 where the layer of thermal decomposition material 220 has been etched back using a thermal treatment as described herein. After this etch back process, the thermal decomposition material 220 fills the gaps between the spacers 160 such that the asymmetric portions 262 of the spacers 160 extend above the remaining thermal decomposition material 220. The thermal decomposition material 220 thereby provides protective plugs to protect the portions of the underlying material layers 130/140 in the gaps between the spacers 160.

FIG. 2C provides a cross-section view of an example embodiment 202 where the spacers 160 of FIG. 2B have been reshaped into reshaped spacers 250 by removing the uneven and asymmetric portions 262. The asymmetric portions 262 can be removed, for example, using an etch process such as an oxide etch process where oxide spacers are used.

FIG. 2D provides a cross-section view of an example embodiment 203 where the plugs of thermal decomposition material 220 are removed between the reshaped spacers 250 using a thermal treatment as described herein. For example, a thermal treatment, such as a low temperature anneal (e.g., from 100 to 450 degrees Celsius), can be used to remove the thermal decomposition material 220 between the reshaped spacers 250.

Because the protective layer and the protective plugs between the spacers are formed of the thermal decomposition material 220, the protective layer/plugs can then be etched back or removed by a thermal treatment such as a low temperature anneal (e.g., from 100 to 450 degrees Celsius). For example, a heated plate can be used to implement this thermal treatment. Because the thermal decomposition material 220 can be etched/removed by thermal treatment such as a low temperature anneal, etch processes such as plasma etch processes (e.g. RIE process) are not needed. As such, gouging is reduced or suppressed during the etch back and removal of the thermal decomposition material 220, and profiles and integrity of the reshaped spacers 250 are maintained. The embodiments described herein, therefore, provide spacer reshaping with the use of thermal decomposition materials without changes to the spacer profiles, without damage to the spacers themselves, and without undesired gouging of underlying layers. As such, a target level of etch uniformity and/or a target level of gouging is achieved in the pattern transfer to one or more underlying material layers.

FIG. 2E provides a cross-section view of an example embodiment 204 where an etch process has been used to transfer the spacer pattern to the underlying material layer 130 such as a hard mask layer. The pattern transfer can be implemented, for example, using an etch process, such as a plasma etch process. Because the asymmetric portions 262 shown in FIG. 2B have been removed from the reshaped spacers 250, this pattern transfer to the underlying layer 130 is achieved without creating the gouging differences in the additional material layer 140 and without suffering the degradation in etch uniformity experienced with the prior solutions.

Figure 3:
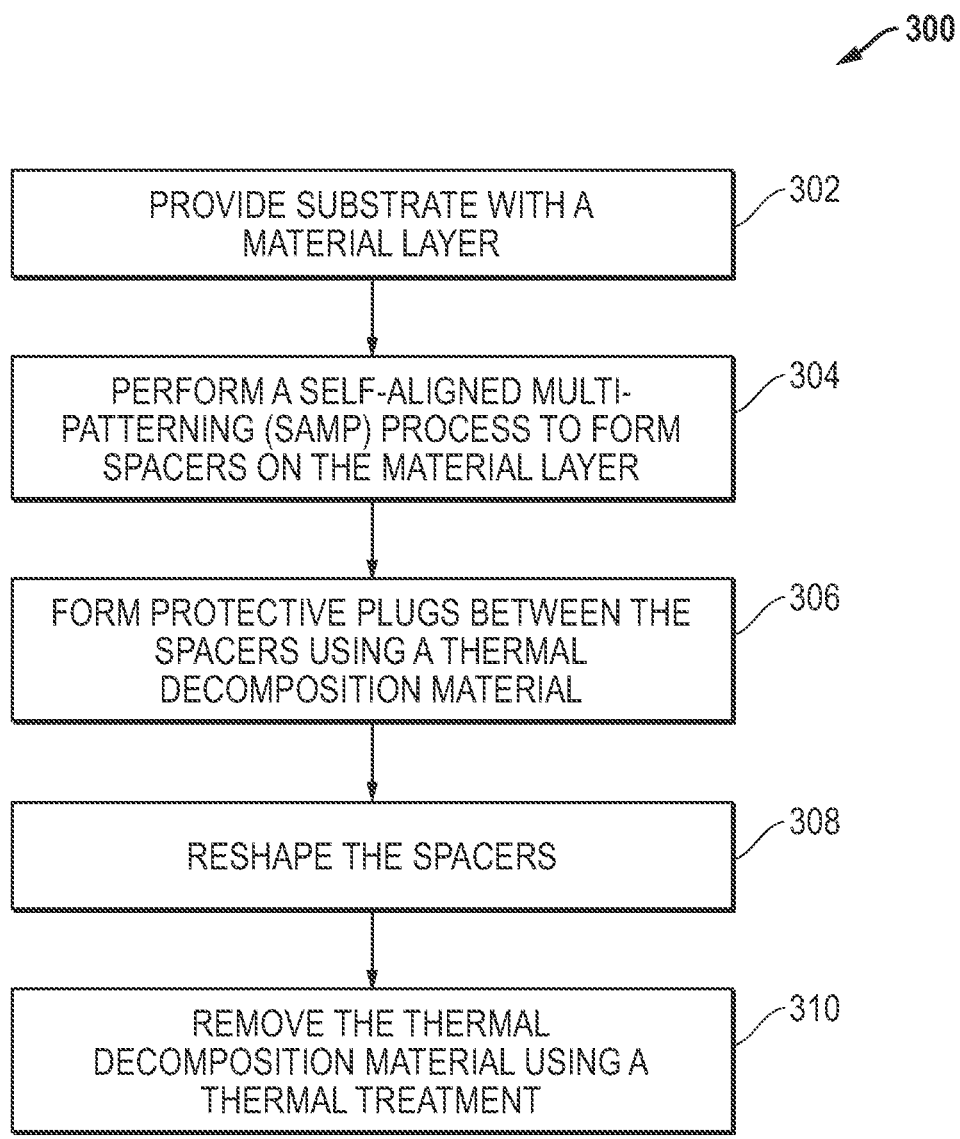
FIG. 3 provides a process flow diagram of an example embodiment where etch uniformity of an underlying layer is improved by using thermal decomposition material as protective plugs between spacers during spacer reshaping.

FIG. 3 provides a process flow diagram of an example embodiment 300 where etch uniformity of an underlying layer is achieved for processing of microelectronic workpieces by using thermal decomposition materials as protective plugs between spacers during spacer reshaping. In block 302 a substrate is provided with a material layer. In block 304, a self-aligned multi-patterning (SAMP) process is performed to form spacers on the material layer. In block 306, protective plugs are formed between the spacers using a thermal decomposition material. For spacer formation in one embodiment, a layer of thermal decomposition material is formed over the spacers, and this thermal decomposition material is then etched back to expose asymmetric portions of the spacers using a thermal treatment. In block 308, the spacers are reshaped, for example, by removing asymmetric portions of the spacers. In block 310, the thermal decomposition material is removed using a thermal treatment. For one embodiment, the pattern of the spacers is then transferred to one or more underlying material layers. Additional and/or different process steps can also be used while still taking advantage of the techniques described herein.

Figure 4A:
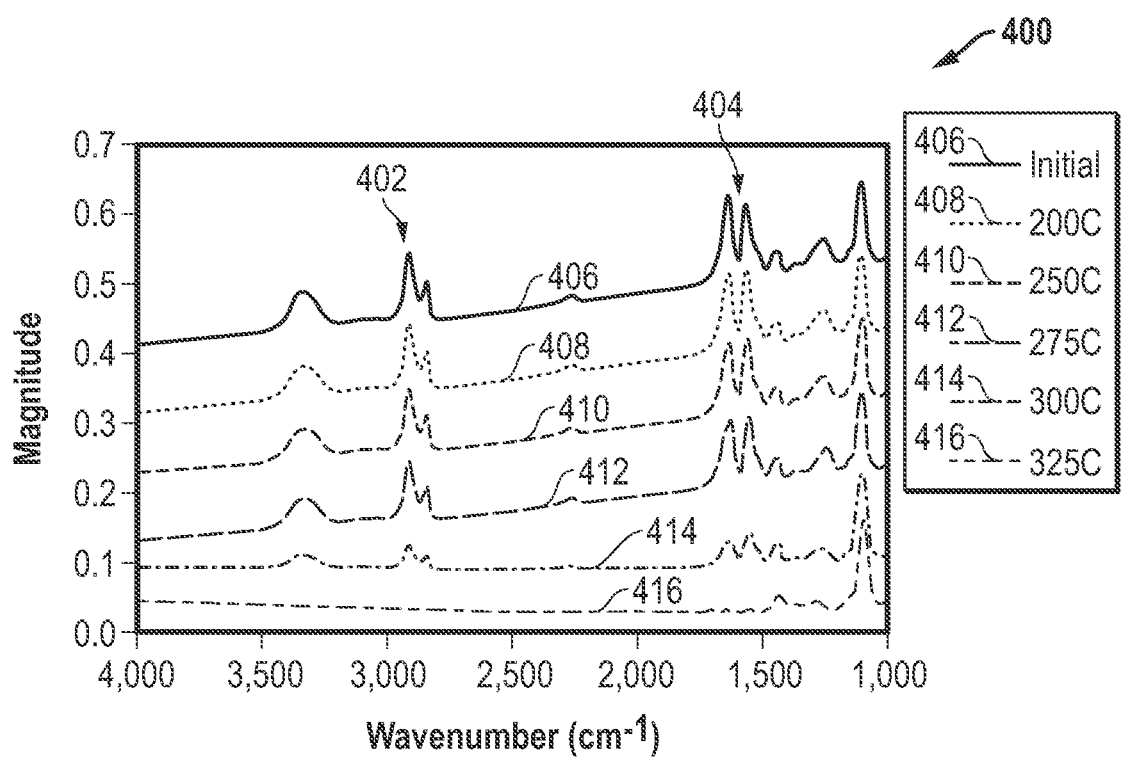
FIGS. 4A-B provide diagrams for example thermal behaviors for representative thermal decomposition materials that can be used for the disclosed embodiments.
Figure 4B:
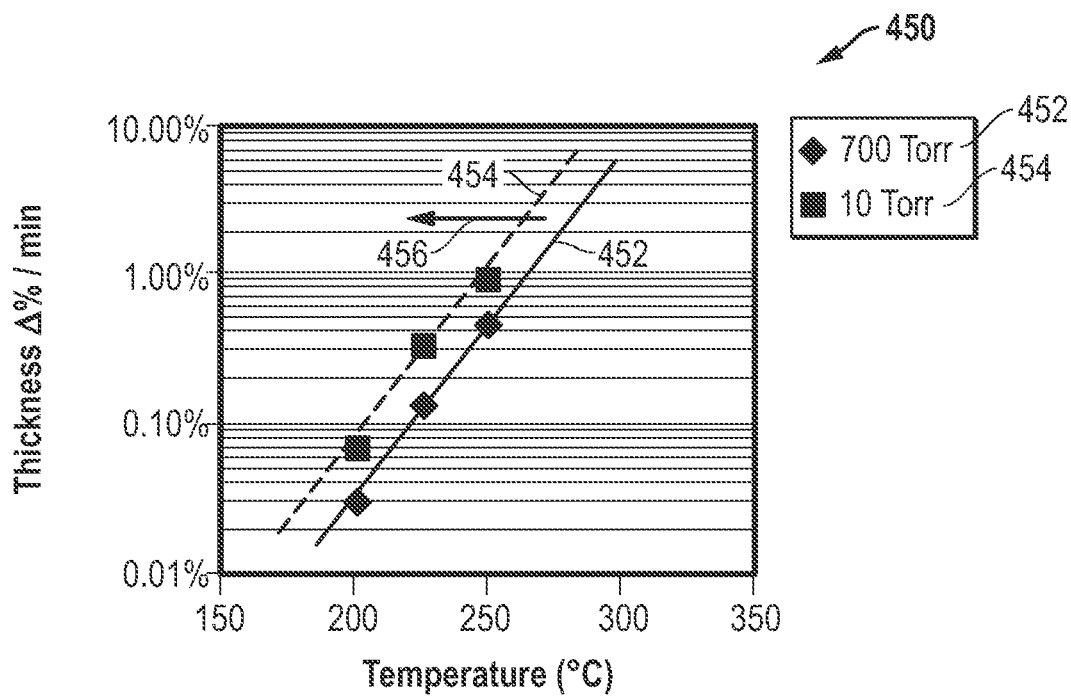

FIGS. 4A and 4B provide diagrams for example thermal behaviors for a representative thermal decomposition material (e.g., ALC material). In FIGS. 4A and 4B, thermal behavior is tested using a 400 nanometer (nm) layer of thermal decomposition material (e.g., a 400 nm ALC layer) formed on silicon. This thermal decomposition layer on silicon is then annealed using a hot plater under a nitrogen gas. This thermal annealing is performed at different temperature levels. After annealing, the removal of the thermal decomposition material layer is tested using FT-IR (Fourier transform infrared spectroscopy) to determine magnitudes (N) for different electromagnetic emissions based upon wavenumber (K) as shown in FIG. 4A. The removal rate is also tested under different pressures as shown in FIG. 4B.

Looking in more detail to FIG. 4A, a diagram 400 is provided that shows the effectiveness of thermal treatments in removing the thermal decomposition material. In particular, thermal decomposition material (e.g., ALC) formed on a substrate (e.g., silicon substrate) is annealed at different temperature levels 406, 408, 410, 412, 414, and 416 (initial, 200° C., 250° C., 275° C., 300° C., 325° C.), for example, using a hot plate anneal under a nitrogen ($N_2$) gas. The spectral peaks 402 and 404 indicate the presence of the thermal decomposition material, and the reduced magnitude levels for the progressively higher temperatures show that more of the thermal decomposition material is removed as the temperature of the anneal is increased. The lack of peaks 402/404 in the FT-IR analysis for the temperature level 416 reveals that the ALC thermal decomposition material is effectively removed in this example for the 325° C. thermal anneal.

FIG. 4B provides a diagram 450 that shows removal rates for thermal treatments of the thermal decomposition material under different pressures. For one thermal treatment test, a pressure of 700 Torr was used. The line 452 represents a linear fit to measured removal rates at different temperatures for thermal anneals performed under this 700 Torr pressure. For another thermal treatment test, a pressure of 10 Torr or near vacuum was used. The line 454 represents a linear fit to measured removal rates at different temperatures for thermal anneals performed under this 10 Torr pressure. As shown by the removing rate diagram 450, the temperature for the thermal treatment to remove the thermal decomposition material can be lowered by reducing the pressure as indicated by arrow 456. As also shown in the removing rate diagram 450, adjusting the temperature of the anneal process also adjusts the relative removal rate of percent change in thickness per minute of thermal treatment. More generally, it is noted that these examples show that the rate for the removal of the thermal decomposition can be controlled by adjusting at least one of temperature or pressure for a processing chamber within which the substrate for a microelectronic workpiece is being processed.

Figure 5:
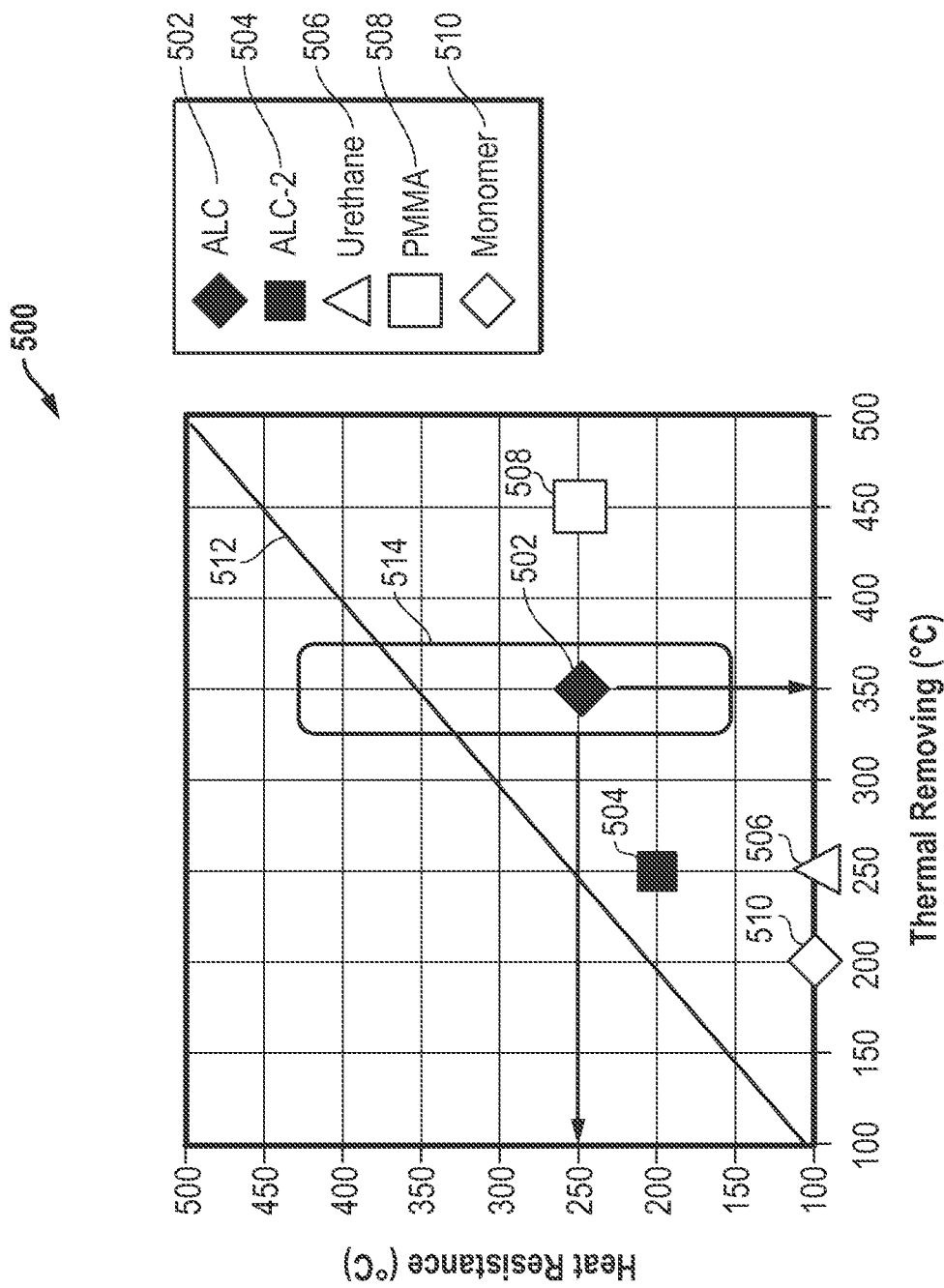
FIG. 5 provides a diagram for thermal removal temperatures and heat resistance for example thermal decomposition materials that can be used for the disclosed embodiments.

FIG. 5 provides a diagram 500 of thermal removal temperatures and heat resistance for example thermal decomposition materials. The thermal removal temperature represents the temperature at which a thermal treatment removes the thermal decomposition material, for example, by a degas process. The heat resistance represents the temperature level below which the thermal decomposition material remains stable and above which the decomposition material becomes unstable.

With respect to thermal removal, temperatures at which different thermal decomposition materials are removed (e.g., degas) are shown for ALC materials (e.g., ALC, ALC-2) 502/504, urethane 506, polymethyl methacrylate (PMMA) 508, and monomers 510. As shown, these materials have thermal removal temperatures for thermal treatments from 100° C. to 450° C. Other materials could also be used that have similar thermal removal characteristics while still taking advantage of the techniques described herein. For example, materials having depolymerizability characteristics such that they can be removed by thermal treatment of 100° C. to 450° C. can be used as a thermal decomposition material for the techniques described herein.

With respect to thermal stability, temperatures at which the different thermal decomposition materials become unstable are also shown for ALC materials (e.g., ALC, ALC-2) 502/504, urethane 506, polymethyl methacrylate (PMMA) 508, and monomers 510. It is noted for certain processes, such as where lithography anneal processes are used, it is desirable for the thermal decomposition material to have thermal stability from 100° C. to 215° C. For example, this thermal stability will allow the thermal decomposition material to resist depolymerization or removal through an etch back process for a silicon antireflective coating (SiARC). For such an embodiment where thermal stability is desired for lower temperatures, it is preferred to use materials having depolymerizability characteristics such that they can be removed by thermal treatments from 250° C. to 450° C. and have thermal stability below this temperature range, for example, from 150° C. to 215° C. As shown with respect to element 514, for example, the ALC material 502 meets these parameters as it has a thermal removal temperature of 350° C. yet remains stable up to 250° C. Other variations could also be used for particular SAMP processes.

It is noted that the ALC and ALC-2 material can be materials such as urea binding resins (e.g., polyurea) that have depolymerizability characteristics such that they can be removed by thermal treatment of less than 450° C., and in another embodiment by thermal treatment of less than 300° C. Through the application of thermal energy during the thermal treatment, the thermal decomposition material depolymerizes and is removed from the substrate. As described herein, by using such thermal decomposition materials, as opposed to standard organic planarization or dielectric layers, gouging of underlying material layers during SAMP processes is reduced or eliminated.

The techniques described herein are not limited to a particular thermal decomposition material, as a variety of materials may be utilized while still obtaining the benefits described herein. However, for one embodiment a urea binding resin, such as polyuria, is used that can be formed via a thin film deposition. An exemplary technique for the formation of a polyurea and the removal of such a polyurea by a depolymerization process to decompose thermally the polyurea are described in more detail in U.S. patent application Ser. No. 15/654,307 filed Jul. 19, 2017, entitled "Method of Fabricating Semiconductor Device, Vacuum Processing Apparatus and Substrate Processing Apparatus," to Yatsuda et al., the disclosure of which is expressly incorporated herein by reference in its entirety. The techniques described in U.S. patent application Ser. No. 15/654,307 include, but are not limited to, copolymerizing isocyanate and amine as raw material monomers to form a urea bond, for example, using a vapor deposition polymerization process. As described in U.S. patent application Ser. No. 15/654,307, a liquid process may also be used to form the polyurea. Further, as described, the polyurea may be subsequently depolymerized to an amine and vaporized by the application of a thermal treatment. It will be recognized, however, that other formation processes and other removal processes may be utilized while still gaining the benefits of the use of a thermal decomposition layer and thermal removal of such layer as described herein. Further, it will be recognized that the techniques described herein are not limited to polyurea and other materials and/or combinations or variants of polyurea and other materials may be utilized as the thermal decomposition material.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to improve etch uniformity of an underlying layer for processing of microelectronic workpieces, the method comprising:
   providing a substrate;
   providing a material layer over the substrate;
   performing a self-aligned multi-patterning (SAMP) process to form spacers on the material layer;
   forming protective plugs between the spacers using a thermal decomposition material;
   reshaping the spacers;
   removing the thermal decomposition material using a thermal treatment; and
   after removing the thermal decomposition material, etching one or more parts of the material layer;

wherein a rate for the removing is controlled by adjusting at least one of temperature or pressure for the thermal treatment.

2. The method of claim 1, wherein a target level of etch uniformity is achieved in the etching.

3. The method of claim 1, wherein the etching of said one or more parts of the material layer includes performing a plasma etch process.

4. The method of claim 1, wherein the material layer is a hard mask layer formed on an additional material layer.

5. The method of claim 4, wherein
a target level of gouging for the additional material layer is achieved in the etching.

6. The method of claim 1, wherein the SAMP process comprises:
forming cores over the material layer;
depositing a spacer layer over the cores;
performing an etch back of the spacer layer to form the spacers as side wall structures adjacent the cores; and
performing a mandrel pull process to remove the cores and leave the spacers.

7. The method of claim 1, wherein the thermal treatment has a temperature range from 100 to 450 degrees Celsius.

8. The method of claim 7, wherein the thermal treatment comprises an anneal process.

9. The method of claim 1, wherein
the thermal decomposition material has a depolymerizability characteristic such that it can be removed by a thermal treatment of 100 to 450 degrees Celsius.

10. The method of claim 1, wherein the thermal decomposition material has a depolymerizability characteristic such that it can be removed by a thermal treatment of 250 to 450 degrees Celsius and such that it is stable from 150 to 215 degrees Celsius.

11. A method to improve etch uniformity of an underlying layer for processing of microelectronic workpieces, the method comprising:
providing a substrate;
providing a material layer over the substrate;
performing a self-aligned multi-patterning (SAMP) process to form spacers on the material layer;
forming protective plugs between the spacers using a thermal decomposition material;
reshaping the spacers;
removing the thermal decomposition material using a thermal treatment; and
after removing the thermal decomposition material, etching one or more parts of the material layer;
wherein the thermal decomposition material comprises at least one of urethane, polymethyl methacrylate (PMMA), or a monomer.

12. A method to improve etch uniformity of an underlying layer for processing of microelectronic workpieces, comprising:
providing a substrate with a material layer;
performing a self-aligned multi-patterning (SAMP) process to form spacers on the material layer;
forming protective plugs between the spacers using a thermal decomposition material;
reshaping the spacers; and
removing the thermal decomposition material using a thermal treatment, wherein the thermal decomposition material comprises an ashing-less coating (ALC) material.

13. The method of claim 12, wherein the ALC material comprises a urea binding resin.

14. The method of claim 13, wherein the urea binding resin comprises polyurea having depolymerizability characteristics such that it can be removed by a thermal treatment of less than 450 degrees Celsius.

15. A method to improve etch uniformity of an underlying layer for processing of microelectronic workpieces, the method comprising:
providing a substrate;
providing a material layer over the substrate;
performing a self-aligned multi-patterning (SAMP) process to form spacers on the material layer;
forming protective plugs between the spacers using a thermal decomposition material;
reshaping the spacers;
removing the thermal decomposition material using a thermal treatment; and
after removing the thermal decomposition material, etching one or more parts of the material layer;
wherein the forming of the protective plugs comprises:
forming a layer of the thermal decomposition material over the substrate, the material layer, and the spacers such that the spacers are covered by the layer of the thermal decomposition material; and
performing an etch back of a part of the layer of the thermal decomposition material such that top portions of the spacers are exposed above remaining parts of the layer of the thermal decomposition material, which remain after etching back the part of the layer of the thermal decomposition material, wherein the remaining parts of the layer of the thermal decomposition material form the protective plugs which are disposed between the spacers and above the material layer during the reshaping of the spacers, and wherein the reshaping of the spacers comprises reshaping of the exposed top portions of the spacers with an etch process.

16. The method of claim 15, wherein the removing of the thermal decomposition material using the thermal treatment comprises, after the reshaping of the spacers, removing the remaining parts of the layer of the thermal decomposition material using the thermal treatment without performing an etch process.

17. The method of claim 16, wherein the protective plugs reduce and/or suppress gouging during the removal of the part of the layer of the thermal decomposition material, and during the reshaping of the spacers, and further wherein gouging is also reduced and/or suppressed by the removal of the remaining parts of the thermal decomposition material without performing an etch process.

* * * * *